United States Patent [19]
Mead et al.

[11] Patent Number: 5,097,305
[45] Date of Patent: Mar. 17, 1992

[54] INTEGRATING PHOTOSENSOR AND IMAGING SYSTEM HAVING WIDE DYNAMIC RANGE

[75] Inventors: Carver A. Mead, Pasadena; Federico Faggin, Los Altos Hills, both of Calif.

[73] Assignee: Synaptics Corporation, San Jose, Calif.

[21] Appl. No.: 657,128

[22] Filed: Feb. 19, 1991

[51] Int. Cl.$^5$ ............................................. H01L 27/14
[52] U.S. Cl. ......................................... 35/30; 357/32; 357/86; 357/59; 357/46; 330/59
[58] Field of Search ............... 357/30 P, 30 G, 30 H, 357/32, 24 LR, 42, 46, 86; 330/59

[56] References Cited

U.S. PATENT DOCUMENTS

| | | | |
|---|---|---|---|
| 3,470,318 | 9/1969 | Webb | 178/7.1 |
| 3,909,520 | 9/1975 | Mend et al. | 178/7.1 |
| 3,919,469 | 11/1975 | Kasperkovitz | 178/7.1 |
| 4,139,783 | 2/1979 | Engeler | 307/221 |
| 4,156,818 | 5/1979 | Collins et al. | 307/221 |
| 4,224,585 | 9/1980 | Tanaka | 333/165 |
| 4,291,224 | 9/1981 | Shirasu et al. | 250/204 |
| 4,434,441 | 2/1984 | Ishizaki et al. | 358/213 |
| 4,528,684 | 7/1985 | Iida et al. | 377/60 |
| 4,556,800 | 12/1985 | Ohta et al. | 250/578 |
| 4,682,203 | 7/1987 | Konda | 357/30 PX |
| 4,737,832 | 4/1988 | Kyuma | 357/30 P |
| 4,780,605 | 10/1988 | Tiemann | 250/201 |
| 4,783,694 | 11/1988 | Merrill et al. | 357/46 X |
| 4,786,818 | 11/1988 | Mead et al. | 250/578 |
| 4,797,560 | 1/1989 | Berger et al. | 250/578 |
| 4,876,534 | 10/1989 | Mead et al. | 340/825.950 |
| 4,906,855 | 3/1990 | Berger et al. | 358/213.23 |
| 4,907,059 | 3/1990 | Kobayashi et al. | 357/46 X |
| 4,948,966 | 8/1990 | Arques et al. | 250/208.1 |
| 4,952,788 | 8/1990 | Berger et al. | 250/208.1 |
| 4,959,723 | 9/1990 | Hashimoto | 358/213.11 |
| 4,972,243 | 11/1990 | Sugawa et al. | 357/32 X |

OTHER PUBLICATIONS

Anders, et al., "Developmental Solid State Imaging System", *IEEE Transactions on Electron Devices*, vol. ED-15, No. 4, Apr. 1968, pp. 191–195.
Dyck and Weckler, "Integrated Arrays of Silicon Photodetectors for Imaging Sensing", *IEEE Transactions on Electron Devices*, vol. ED-15, No. 4, Apr. 1968, pp. 196–201.
Noble, Self-Scanned Silicon Image Detector Arrays, *IEEE Transactions on Electron Devices*, vol. ED-15, No. 4, Apr. 1968, pp. 202–209.
Soref, "Monolithic Silicon Mosaics for Far-Infrared Imaging", *IEEE Transactions on Electron Devices*, vol. ED-15, No. 4, Apr. 1968, pp. 209–214.
Sadasiv, et al., "Thin–Film Circuits for Scanning Image-Sensor Array Array", *IEEE Transactions on Electron Devices*, vol. ED-15, No. 4, Apr. 1968, pp. 215–219.

(List continued on next page.)

*Primary Examiner*—William Mintel
*Attorney, Agent, or Firm*—Kenneth D'Alessandro

[57] ABSTRACT

An integrating photosensor includes an NPN phototransistor having its collector connected to a source of positive voltage, a P-channel MOS transistor having its gate connected to row-select line, its source connected to the emitter of the phototransistor, and its drain connected to a column sense line. The NPN phototransistor has an intrinsic base-collector capacitance. An integrating sense amplifier according to the present invention includes an amplifying element having an inverting input and a non-inverting input. The non-inverting input is connected to a source of reference voltage the inverting input is connected to a sense line. A P-channel balance transistor is connected between the inverting input and the output of the amplifying element and a capacitor is also connected between the inverting input and output of the amplifying element. An exponential feedback element is connected between the output and the inverting input of the amplifying element. A plurality of integrating photosensors is disposed in an array of rows and columns, with a given row select line connected to the gates of P-channel MOS transistors associated with that given row and a given column sense line connected to the drains of the P-channel MOS transistors associated with that given column.

9 Claims, 3 Drawing Sheets

OTHER PUBLICATIONS

Stewart, "A Solid State Image Converter", *IEEE Transactions on Electron Devices*, vol. ED-15, No. 4, Apr. 1968, pp. 220-225.

Tepper, et al., "Transfer Functions of Imaging Mosaics Utilizing the Charge Storage Phenomena of Transistor Structures", *IEEE Transactions on Electron Devices*, vol. ED-15, No. 4, Apr. 1968, pp. 226-237.

Joy, et al., "Phototransistor Operation in the Charge Storage Mode", *IEEE Transactions on Electron Devices*, vol. ED-15, No. 4, Apr. 1968, pp. 237-248.

Callahan, et al., "Performance Characteristics of Pulsed Phototransistor Structures Under Various Conditions", *IEEE Transactions of Electron Devices*, vol. ED-15, No. 4, Apr. 1968, pp. 248-256.

List, "Solid State Imaging—Methods of Approach", *IEEE Transactions on Electron Devices*, vol. ED-15, No. 4, Apr. 1968, pp. 256-261.

INTEGRATING PHOTOSENSOR AND IMAGING SYSTEM HAVING WIDE DYNAMIC RANGE

BACKGROUND OF THE INVENTION

1. Field Of The Invention

The present invention relates to imaging arrays and systems. More particularly, the present invention relates to a single-chip high-sensitivity imaging system for producing serial-scanned outputs.

2. The Prior Art

Imaging circuits typically include a two-dimensional array of photosensors, each of which converts a pixel of light energy from an image into an electrical signal representing the light value of the pixel. The imaging circuit scans the photosensors to read out the electrical signals representing the light values of all pixels from an image.

As a result of the advances in semiconductor technology, single chip imaging circuits are known in the art. The most common single-chip imaging technology is the charge coupled device (CCD) camera. A CCD device operates by accumulating photo-generated charge in potential wells in a semiconductor substrate at or slightly under the surface of the substrate. The depth of these wells is controlled by the voltage on gate electrodes located just above the surface of the substrate. By manipulating the voltage on several of the gates, the accumulated charge can be shifted along the surface to a sensing point, where it is amplified into a signal which can be driven off of the chip.

Using modern MOS processing techniques, the transport of charge in a CCD structure can be accomplished with almost perfect efficiency at video rates; typically less than ten parts per million of the charge in a well is lost in each transfer. In a typical serial-scanned CCD imager, such as is used for video applications, the charge is shifted out once per frame, and hence the total charge in each well is collected over the entire frame time, typically 1/60 second. Sensing technologies which operate in this manner, by accumulating charge over the entire time between scanout events, are called integrating photosensors.

Despite its technical achievements and wide spread commercial success, CCD technology has its limitations. Because the photo-generated charge is shifted directly, the gain of the device (electrons out per photon in) is always less than unity. Because the charge stored in each well is limited, the CCD imager has severe dynamic-range constraints. At the low end, the sensitivity is limited by how small a charge can be sensed above the noise of the readout amplifier. At the high end, the range is limited by the total charge that can be shifted from one well into the next.

To overcome these dynamic-range limitations of the CCD imager, a number of attempts have been made to use phototransistors to sense incoming light, such as seen in *Analog VLSI and Neural Systems*, by Carver A. Mead, Addison Wesley Publishing Co., 1989, at pp. 260-261. Phototransistors can have a gain of over 100 electrons per absorbed photon. In a typical application, the photocurrent from each phototransistor is fed into a device with exponential current-voltage characteristics, such as a pair of diode-connected MOS transistors. The output voltage of such a device is then a logarithmic function of the light level. These devices show much wider dynamic range than do CCD devices, but are not as sensitive at low light levels because they operate in instantaneous-current mode rather than in integrating mode.

Photons absorbed in the neighborhood of a phototransistor collector-base or emitter-base junction create electron-hole pairs that are collected by the nearest p-n junction. Minority carriers collected by either junction act as base current, and are multiplied by the current gain of the transistor to produce the collector current. The emitter current is the sum of the base current and the collector current. For this reason, the emitter current is usually used as the output of the sensor.

Prior art phototransistor sensors suffer from low-current limitations. The current-gain of the phototransistor sensor device is high at high photocurrents, where it is not needed, and is low at low photocurrents, where it would desirably be higher. Because of this behavior of phototransistors, they have not found widespread use in commercial scanned imagers.

It is an object of the present invention to provide an improved photosensor which can be integrated into a single chip imaging array.

It is another object of the present invention to provide an improved single-chip serial-scanned imager, which can exhibit higher sensitivity at lower light levels than current-mode imagers, and in the same device operate over a dynamic range larger than that achievable with CCD imagers.

BRIEF DESCRIPTION OF THE INVENTION

According to a first aspect of the present invention, an integrating photosensor includes an NPN phototransistor having its collector connected to a source of positive voltage, a P-channel MOS transistor having its gate connected to a row-select line, its source connected to the emitter of the phototransistor, and its drain connected to a column sense line. The NPN phototransistor has an intrinsic base-collector capacitance.

In a second aspect of the present invention, an integrating sense amplifier according to the present invention includes an amplifying element having an inverting input and a non-inverting input. The non-inverting input is connected to a source of reference voltage the inverting input is connected to a sense line. A P-channel balance transistor is connected between the inverting input and the output of the amplifying element and a capacitor is also connected between the inverting input and output of the amplifying element. An exponential feedback element is connected between the output and the inverting input of the amplifying element. In a presently preferred embodiment, this feedback element includes a first P-channel feedback transistor having its source connected to the sense line and its gate and drain connected together to the source of a second P-channel feedback transistor. The gate of the second P-channel feedback transistor is connected to the output of the amplifying element, and its drain is connected to a fixed voltage source, such as ground.

DETAILED DESCRIPTION OF A PREFERRED EMBODIMENT

According to a first aspect of the present invention, an improved integrating photosensor is disclosed. The photosensor of the present invention overcomes the limitations of prior art phototransistor photosensors.

Figure 1:
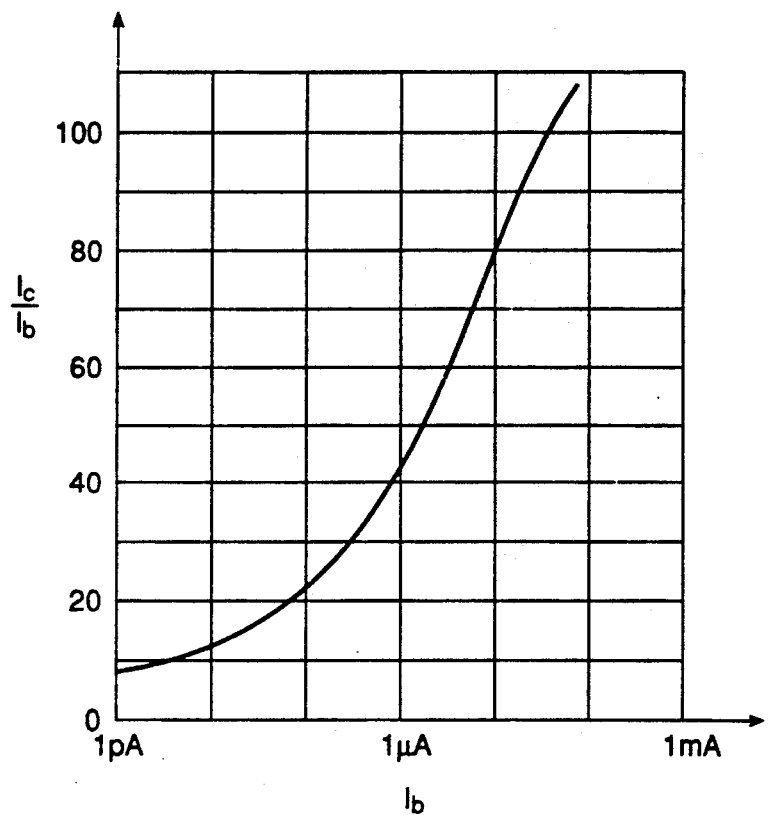
FIG. 1 is a graph showing the measured current gain of a typical phototransistor sensor device as a function of its base current.

The low-current limitation of a prior art phototransistor photosensor can be appreciated with reference to FIG. 1, which shows the measured current gain of a typical phototransistor sensor device as a function of its base current. It can be seen that the current-gain of the phototransistor photosensor device is high at high photocurrents, where it is not needed, and is low at low photocurrents, where it would desirably be higher. Because of this behavior, phototransistors have not found widespread use in commercial scanned imagers.

Figure 2A:
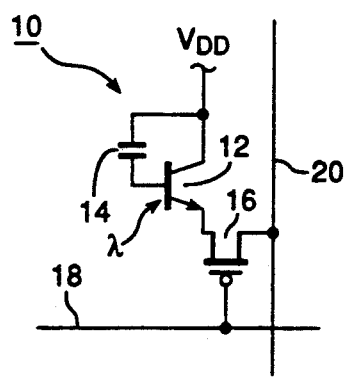
FIG. 2a is a schematic diagram of an integrating photosensor suitable for use in the invention.

Referring now to FIG. 2a, a presently preferred pixel integrating photosensor circuit 10 suitable for use in a single-chip integrated circuit imaging array is shown. The photosensor circuit 10 of the present invention includes NPN phototransistor 12, having its collector connected to a source of positive voltage, shown as $V_{DD}$ in FIG. 2a. The intrinsic base-collector capacitance of phototransistor 12 is shown explicitly as capacitor 14. NPN phototransistor 12 preferably has a gain larger than 100. Those of ordinary skill in the art will recognize that, if a larger value of capacitance is desired, an additional capacitor may be fabricated in parallel with the intrinsic base-collector capacitance.

Integrating photosensor circuit 10 also includes P-channel MOS pass transistor 16, having its gate connected to a row-select line 18, its source connected to the emitter of phototransistor 12, and its drain connected to column sense line 20.

In a preferred implementation of the invention, a plurality of photosensor circuits 10 are formed in an N-well in a standard N-well CMOS integrated circuit fabrication process, with the single addition of a p type base diffusion step. The N-channel source-drain diffusion is used as the emitter of the phototransistor 12, enclosed within a base region formed by the p base diffusion. The collector of the phototransistor is formed by the N-well, and covers the entire photosensor array. Pass transistor 16 is also formed in the N-well and thus must be a p-channel MOS transistor. Because the N-well diffusion covers the entire photosensor array, the individual pixel circuits can be very dense since there are no large well-to-well spacing distances which waste semiconductor substrate area.

Figure 2B:
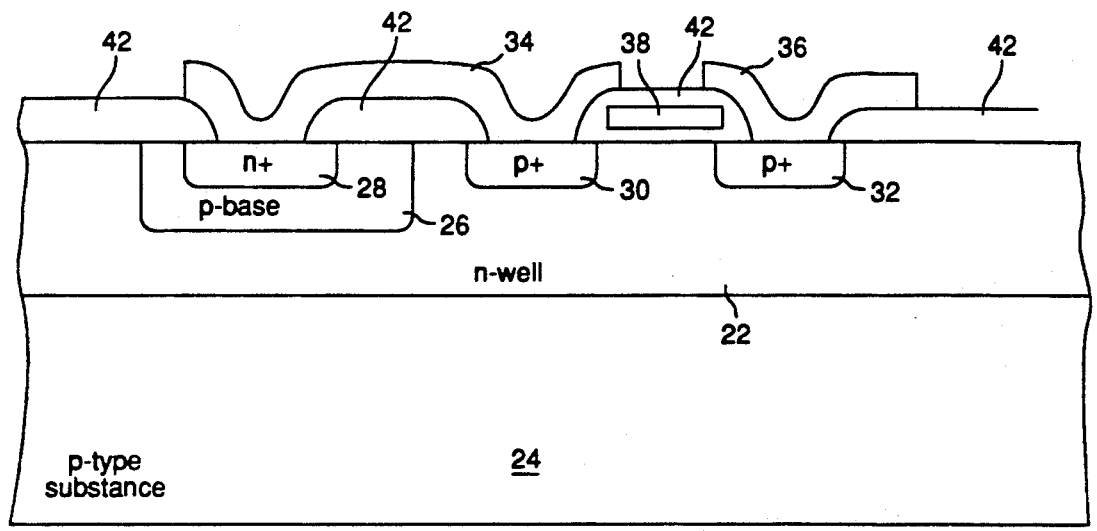
FIG. 2b is a cross sectional view of an embodiment of the circuit of FIG. 2a implemented in an N-well CMOS process.

Referring now to FIG. 2b, a cross section of a presently preferred embodiment of a photosensor circuit 10 in an N-well CMOS process is shown. The entire array of photosensors 10 is fabricated in N-well 22 formed in semiconductor substrate 24. N-well 22 forms the collector of phototransistor 12. A p-type region 26 in N-well 22 forms the base of phototransistor 12 and an n+ region 28 in p-type base region 26 forms the emitter of phototransistor 12.

Diffused p-type regions 30 and 32 form the source and drain, respectively of P-channel MOS pass transistor 16. A first metal line 34 connects emitter region 28 of phototransistor 12 to source region 30 of P-channel MOS pass transistor 16. A second metal line 36 connected to drain region 32 of P-channel MOS pass transistor 16 forms column line 20. Finally, polysilicon gate 38 forms row line 18. Insulating layer 42 isolates first and second metal lines 34 and 36 and polysilicon gate 38 from other circuit elements.

In a typical implementation in a one micron CMOS process, NPN phototransistor 12 may have a base region about $7\mu$ by $10\mu$ and P-channel pass transistor 16 may be about $3\mu$ wide and have a channel length of about $1.5\mu$. The entire pixel is $13\mu$ by $13\mu$, allowing for a highly dense array and making it competitive with the high quality CCD imager circuits.

During normal circuit operation, sense line 20 is held at a fixed voltage, typically 1.5 volts below the collector voltage of phototransistor 12. For the entire frame time except that period when the pixel is being sensed, row-select line 18 is held at or near $V_{DD}$, thereby turning off pass transistor 16 and effectively isolating the emitter of phototransistor 12 from sense line 10. As photogenerated carriers are collected by the base of phototransistor 12, the base-collector capacitor 14 becomes more positively charged because no base-to-emitter current is allowed to flow. The photocurrent is thus integrated on the base-collector capacitance over this time period.

When it is desired to sense the charge accumulated in base-collector capacitor 14, row-select line 18 is abruptly driven low, thereby turning on P-channel pass transistor 16. The voltage on the emitter of phototransistor 12 is driven rapidly to the voltage on sense line 20, thereby forward biasing the emitter-base junction of phototransistor 12. The integrated charge stored on the base of phototransistor 12 is discharged into the base terminal of phototransistor 12, and a current equal to the base current multiplied by the current gain of phototransistor 12 is delivered to sense line 20.

Because the discharge occurs very rapidly, phototransistor 12 is operated at much higher currents than the photocurrent. At this higher current level, the current gain of phototransistor 12 is much higher than unity as shown in FIG. 1. The mode of operation contemplated by the present invention thereby allows many charge carriers to be delivered to sense line 20 for every photo-generated carrier collected by the base.

Figure 3:
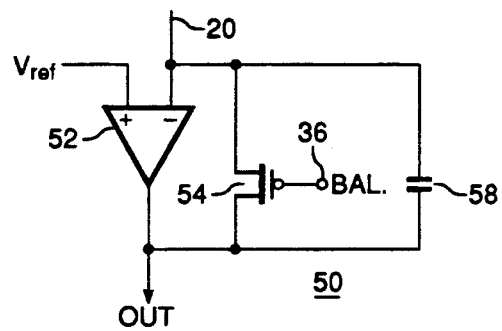
FIG. 3 is a sense amplifier suitable for use in the present invention.

Referring now to FIG. 3, a typical integrating sense amplifier 50 suitable for sensing the charge delivered to sense line 20 by a single pixel is shown. Sense amplifier 50 includes an amplifying element 52, which may be an operational amplifier. The non-inverting input of amplifier 52 is connected to a source of reference voltage $V_{ref}$ and its inverting input is connected to sense line 20.

A P-channel balance transistor 54 is connected between the inverting input and the output of amplifier 52. Its gate is connected to a balance line 56. A capacitor 58 is also connected between the inverting input and output of amplifier 52.

Before row select line 20 is brought low to read a pixel value, amplifier 52 is brought into a known state by bringing the gate of p-channel balance transistor 56 low to turn it on, thereby effectively shorting the inverting input of amplifier 52 to its output and hence driving both input and output voltages to reference voltage $V_{ref}$. The gate of P-channel balance transistor 56 is then brought high, thereby isolating the input sense line 20 from the output of amplifier 52. The pixel is then addressed by bringing its row select line low, thus delivering its stored charge multiplied by the current gain of its phototransistor onto sense line 20.

Amplifier 52 will respond to this charge by maintaining its input at a nearly constant level by the feedback action of capacitor 58. The output voltage of amplifier 52 after the pixel has delivered all of its charge to sense line 50 will be lower than its initial value by that charge divided by the value of capacitor 58.

Figure 4:
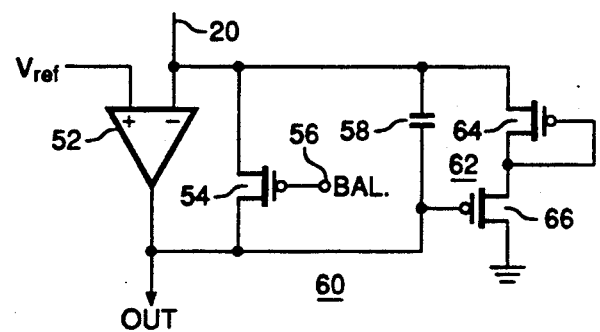
FIG. 4 is a schematic diagram of a presently-preferred sense amplifier for use in the present invention.

The operation of the imaging array of the present invention at high light levels may be improved by using the sense amplifier shown in FIG. 4. Sense amplifier 60 includes all of the elements of amplifier 50. These elements have been assigned the same reference numerals as the corresponding elements of FIG. 3.

In addition to the elements of the sense amplifier circuit 50 of FIG. 3, sense amplifier 60 includes an exponential feedback element 62. In a presently preferred embodiment, exponential feedback element 62 includes first and second P-channel feedback transistors 64 and 66. First P-channel feedback transistor 64 has its source connected to sense line 20, and its gate and drain connected together to the source of second P-channel feedback transistor 66. The gate of second P-channel feedback transistor 66 is connected to the output of amplifier 52, and its drain is connected to a fixed voltage source, shown as ground in FIG. 4.

The effect of first and second P-channel feedback transistors 64 and 66 is to provide a current which increases exponentially as the output voltage of amplifier 52 becomes more negative. This exponential function has a very small slope for output voltage excursions less than approximately 1 volt, thereby allowing sense amplifier 60 to function as a normal charge-sensing amplifier at low light levels. However, at higher light levels, by virtue of the current through the exponential element, sense amplifier 60 becomes a current-sensing amplifier, and its output voltage decreases as a logarithmic function of the input current from the pixel.

Those of ordinary skill in the art will recognize that the sense amplifier circuit of FIG. 4 automatically acts as both an integrating detector at low light levels, and as a current-mode detector at high light levels. The dynamic range of an imaging array is greatly increased by use of a sense amplifier according to the present invention.

Figure 5:
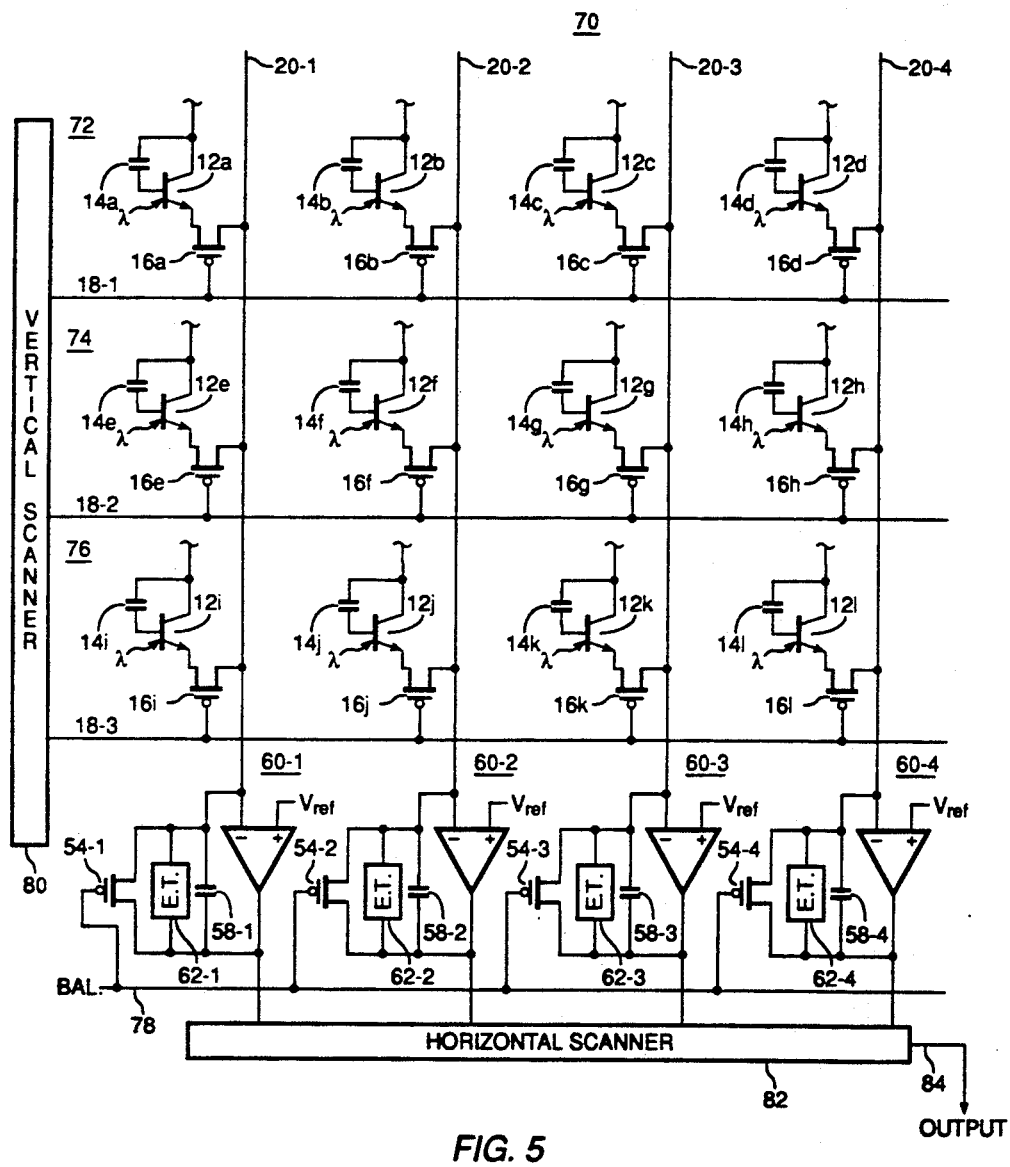
FIG. 5 is a block diagram of an imaging array comprising integrating photosensors according to a presently-preferred embodiment of the invention.

Referring now to FIG. 5, an integrating imaging array according to a presently preferred embodiment of the invention is illustrated. The array 70 of FIG. 5 is shown including twelve integrating photosensors according to the present invention arranged into three rows and four columns. Those of ordinary skill in the art will readily observe that the embodiment shown in FIG. 5 is illustrative and not limiting in nature, and that an array of any size is contemplated by the present invention, limited only by the inherent density limitations of CMOS technology.

Row 72 of array 70 includes photosensors 10a–10d. Row 74 of array 70 includes photosensors 10e–10h. Row 76 of array 70 includes photosensors 10i–10l. First row line 18-1 is connected to the gates of P-channel transistors 16a–16d. Second row line 18-2 is connected to the gates of P-channel transistors 16e–16h. Third row line 18-3 is connected to the gates of P-channel transistors 16i–16l. First sense line 20-1 is connected to the drains of P-channel transistors 16a, 16e, and 16i of the first column in the array 70. Second sense line 20-2 is connected to the drains of P-channel transistors 16b, 16f, and 16j of the second column in the array 70. Third sense line 20-3 is connected to the drains of P-channel transistors 16c, 16g, and 16k of the third column in the array 70. Fourth sense line 20-4 is connected to the drains of P-channel transistors 16d, 16h, and 16l of the fourth column in the array 70.

First sense amplifier 60-1 is connected to first sense line 20-1. Second sense amplifier 60-2 is connected to second sense line 20-2. Third sense amplifier 60-3 is connected to third sense line 20-3. Fourth sense amplifier 60-4 is connected to fourth sense line 20-4. As will be apparent from the discussion accompanying FIG. 2a, a row of pixels from array 70 may be read by pulsing balance line 78, followed by bringing the desired one of row lines 18-1 through 18-4 to a low logic level.

In a presently preferred embodiment, a vertical scanning circuit 80 is adapted to select only one of the row select lines 18 at any given time. Circuits for performing this function are well known in the art. In a true serial scanned imager, horizontal scanning circuitry 82 is adapted to select the signal from the output of one of amplifiers 60 at a given time, to form the output 84 of the array. Scanning circuits suitable for use as horizontal and vertical scanning circuits 80 and 82 are described in *Analog VLSI and Neural Systems*, by Carver A. Mead, Addison Wesley Publishing Co., 1989, at pp. 263–267. If parallel outputs are desired, all or a subset of amplifier outputs can be used directly without employing horizontal scanning circuit 82.

While a presently-preferred embodiment of the invention has been disclosed, those of ordinary skill in the art will, from an examination of the within disclosure and drawings be able to configure other embodiments of the invention. For example, those of ordinary skill in the art will readily observe that the array of the present invention may be easily fabricated in a P-well in a P-well CMOS process, and that, in such an embodiment, the voltage levels and power supplies would be reversed. These other embodiments are intended to fall within the scope of the present invention which is to be limited only by the scope of the appended claims.

What is claimed is:

1. An integrating imaging array disposed on a single piece of semiconductor substrate material, including:

a plurality of integrating photosensors arranged in a matrix including a plurality of rows and columns, each of said integrating photosensors including a bipolar phototransistor having a base, a collector, and an emitter, said collector connected to a voltage source, a sense node, an enable node, a semiconductor switch connected between said emitter and said sense node, said semiconductor switch having a control input connected to said enable node;

a plurality of row lines, a unique one of said row lines associated with a particular row in said array, the enable nodes of all of said integrating photosensors associated with said particular row connected to said unique one of said row lines;

a plurality of sense lines, a unique one of said sense lines associated with a particular column in said array, the sense nodes of all of said integrating photosensors associated with said particular column connected to said unique one of said column lines;

a plurality of sense amplifiers, each of said sense amplifiers having an input and an output, the input of one of said sense amplifiers connected to each of said sense lines.

2. The integrating imaging array of claim 1 wherein the input of each of said sense amplifiers is an inverting input and wherein each of said sense amplifiers further includes a capacitor and an exponential feedback element connected between its inverting input and its output.

3. The integrated imaging array of claim 2 wherein each of said sense amplifiers further includes means for selectively shorting its output to its inverting input.

4. The integrated imaging array of claim 1, further including:
means for selecting one of said rows; and
means for adapting said amplifier to a known state when none of said rows are selected.

5. An integrating imaging array disposed on a single piece of semiconductor substrate material of a first conductivity type, including:
a plurality of integrating photosensors disposed in a well of a second conductivity type opposite to said first conductivity type, said plurality of integrating photosensors arranged in a matrix including a plurality of rows and columns, each of said integrating photosensors including a bipolar phototransistor having a base region formed from a region of said first conductivity type disposed in said well, a collector region formed by said well, and an emitter region formed from a region of said second conductivity type disposed in said base region, said well connected to a voltage source, first and second spaced apart regions of said first conductivity type disposed in said well forming a channel therebetween, said first region electrically connected to said emitter region, said second region comprising a sense node, a polysilicon gate disposed above and insulated from said channel, said polysilicon gate comprising an enable node;
a plurality of row lines, a unique one of said row lines associated with a particular row in said array, the enable nodes of all of said integrating photosensors associated with said particular row connected to said unique one of said row lines;
a plurality of sense lines, a unique one of said sense lines associated with a particular column in said array, the sense nodes of all of said integrating photosensors associated with said particular column connected to said unique one of said column lines;
a plurality of sense amplifiers, each of said sense amplifiers having an input and an output, one of said sense amplifiers connected to each of said sense lines.

6. The integrating imaging array of claim 5 wherein the input of each of said sense amplifiers is an inverting input and wherein each of said sense amplifiers further includes a capacitor and an exponential feedback element connected between its inverting input and its output.

7. The integrated imaging array of claim 6 wherein each of said sense amplifiers further includes means for selectively shorting its output to its inverting input.

8. The integrated imaging array of claim 5, further including:
means for selecting one of said rows; and
means for adapting said amplifier to a known state when none of said rows are selected.

9. The integrated imaging array of claim 5, further including;
means for serially selecting each of said rows in order; and
means for serially scanning the outputs of said sense amplifiers when each of said rows has been selected.

* * * * *